United States Patent [19]

Klees

[11] 4,155,084
[45] May 15, 1979

[54] SOLID STATE LED DISPLAY DEVICE

[75] Inventor: George N. Klees, Fullerton, Calif.

[73] Assignee: The United States of America as represented by the Secretary of the Navy, Washington, D.C.

[21] Appl. No.: 832,321

[22] Filed: Sep. 8, 1977

[51] Int. Cl.² .............................................. G06F 3/14
[52] U.S. Cl. .................................. 340/753; 340/782; 340/793
[58] Field of Search .................... 324/122, 96, 133; 340/324 R, 324 M, 336; 364/518, 514

[56] References Cited

U.S. PATENT DOCUMENTS

| | | | |
|---|---|---|---|
| B 351,493 | 1/1975 | Ingle | 340/336 |
| 3,619,574 | 11/1971 | Mindheim | 324/96 |
| 3,754,121 | 8/1973 | Delay et al. | 324/96 |
| 3,969,672 | 7/1976 | Wallender et al. | 324/122 |
| 4,044,304 | 8/1977 | Hamaguchi et al. | 324/133 |

Primary Examiner—Marshall M. Curtis
Attorney, Agent, or Firm—R. S. Sciascia

[57] ABSTRACT

A visual display system constructed to provide increased resolution of a digital signal representing a measured analog value. An analog signal is converted to a digital number represented by a group of most significant bits and lesser significant bits. Each group of digits is stored in a digital storage circuit with the group of most significant bits additionally being stored in a preset counting circuit and increased in value by a logical 1. The outputs of the storage and counting circuits holding the group of most significant bits are then coupled to energize elements of a visual display for a time proportional to the digital number represented by the group of lesser significant bits. The magnitude of the analog signal can then be determined by observing the position and relative length of time that any of two elements of the display are energized over a sampling period.

15 Claims, 2 Drawing Figures

SOLID STATE LED DISPLAY DEVICE

BACKGROUND OF THE INVENTION

The present invention relates to solid state display systems for visually displaying an analog value and more particularly to an improved system and technique for increasing the resolution of lighted displays controlled by coded digital input signals.

In the prior art, many types of instruments are utilized to enable the measurement of analog signals developed in various electrical and mechanical systems. Such instruments are exampled by voltmeters which conventionally use D'Arsnoval construction for the measurement of voltage and current. In performing such measurements these particular instruments are subject to substantial inaccuracies caused by scale nonlinearity, overshoot, and pointer movement in response to a particular analog signal. As a result, meter type instruments have been replaced by various solid state digital displays which eliminate most of the problems associated with the above-noted mechanical movements.

While such instruments have been successful in overcoming many of the problems associated with mechanical-type measuring devices, the same have suffered from problems imposed by the limitations of the display elements. In this regard, conventional solid state display devices generally include an input representing an analog value, an analog to digital converter, various logic circuits designed to store and decode the digital signal, and an array of light elements such as light emitting diodes (LEDs) to provide a visual output of the converted analog signal. For any analog signal, therefore, the magnitude of the signal will be represented by the illumination of a particular element in relation to all other elements in the display. In particular, for any given number of digital bits representing an analog value, the accuracy and resolution of the display will depend on the total number of individual light elements forming the display. Thus, increased resolution and accuracy can normally only be achieved by increasing the total number of elements. Since most practical visual elements are, however, limited to a finite dimension, the maximum practical size for any given application has an upper limit that approaches 100 elements in a typical LED display. In terms of resolution, any analog input with this number of elements would be limited to a word of approximately eight bits and an accuracy of 1 percent.

Accordingly, there is a continuing need to provide solid state displays which can eliminate the above-noted limitations. The present invention has therefore been developed to overcome the specific shortcomings of the above-known and similar techniques and to provide a technique for improving the resolution and accuracy of solid state visual displays.

SUMMARY OF THE INVENTION

It is therefore an object of this invention to provide a solid state display that is inexpensive in construction yet provides enhanced resolution of a digital signal representing an analog value.

Another object of the invention is to provide a solid state display by using plural light elements to represent the magnitude of an analog signal.

A further object of the invention is to provide a visual display which employs a single digital number to energize plural visual elements to represent an analog signal.

Still another object of the invention is to provide a solid state display which employs a portion of a digital number to control the energization of plural light elements.

Yet another object of the invention is to provide a solid state display wherein the position and relative brightness of plural light elements determines the magnitude and resolution of an analog signal.

The above and other objects are accomplished by providing portions of a series of digital bits representing an analog signal to a plurality of storage circuits. The portions are formed by separating the series into a group of most significant and least significant bits. The group of most significant bits is coupled to individual storage circuits such that one storage circuit provides a digital output identical to the group of most significant bits and the other storage circuit provides a digital output having the same number of most significant bits with its value increased by one. Each of the outputs from such storage circuits is coupled to a data selector which controls the coupling of both digital outputs to a data decoder for driving a visual display. The group of least significant bits of the series of digital bits is likewise coupled to a storage circuit and compared with the output of a counter having the same number of bits as the total number of least significant bits. The counter is made to cyclically count from zero to its full value (all bit positions are logic 1's) and its output is compared to the output of the storage circuit containing the group of least significant bits. Based on this comparison, a signal is provided to control the data selector such that digital outputs of each of the storage circuits holding the most significant bits are coupled through the decoder to energize separate light elements of the visual display for differing time periods. The magnitude and resolution of the analog signal will therefore be based on the relative position and brightness of the multiple elements in the display.

Other objects, advantages and novel features of the invention will become apparent from the following detailed description of the invention when considered in conjunction with the accompanying drawings wherein:

DETAILED DESCRIPTION OF A PREFERRED EMBODIMENT

Figure 1:
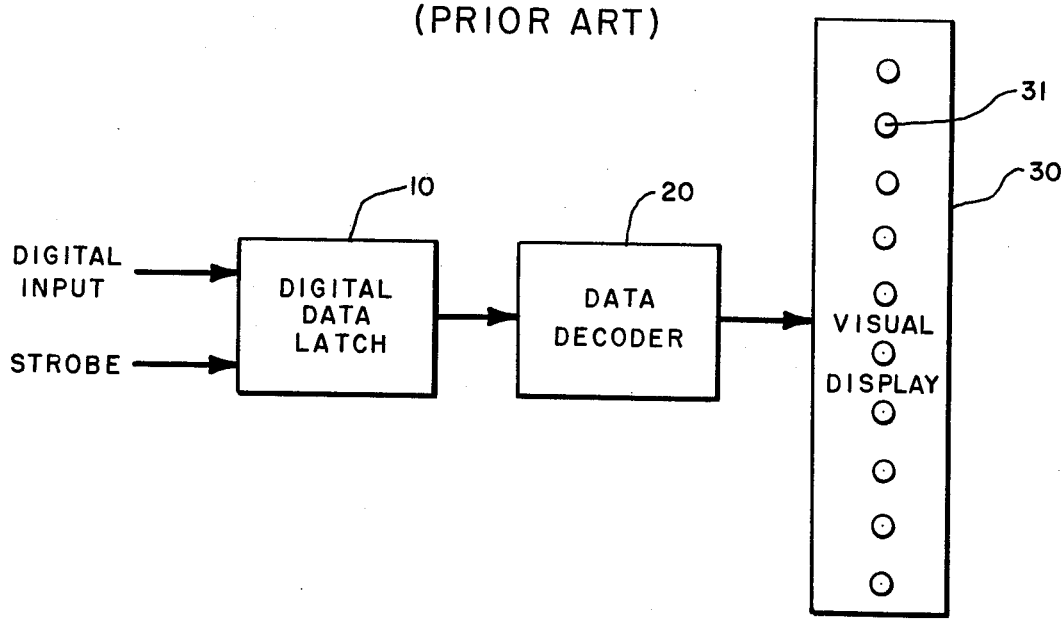
FIG. 1 is a schematic diagram showing a conventional solid state display system.

Referring now to FIG. 1, a typical solid state display system is illustrated wherein like numerals are used to refer to like elements throughout the drawings. In particular, a digital input which is to be displayed as an analog magnitude is derived from an analog to digital converter, a digital computer, or any other similar source. The digital number, composed of a series of digital bits and representing a particular analog value, is coupled to a digital latch 10 which samples and stores the digital input upon receipt of a strobe pulse. Typically, the latch 10 comprises a shift register constructed from a plurality of flip-flops which store the sampled signal to provide a steady state output during the conversion of any other analog signal to be provided as digital input to latch 10. The digital output of latch 10 is then coupled as input to a conventional data decoder 20.

Decoder 20 in turn provides an output to the visual display 30 to cause the energization of an appropriate visual element corresponding to the magnitude represented by the sampled digital bits. Thus as can be seen, the visual display 30 (typically an LED array), will provide an output representing the original analog signal. If the LED display is arranged in a linear configuration, multiple sampling will cause the output on the visual display to provide the equivalent of the conventional meter movement without the requirement for moving parts.

While the above described apparatus enables more convenient and versatile operation, most practical applications of such devices are limited by the size restrictions imposed by the display elements (LEDs). Thus, for most applications the maximum practical size for LEDs having a diameter of 0.1 in. limit the LED fields to about 100 LEDs. In that instance, the input word length would be severely limited and restrict the accuracy of any reading. As a result, most present decoders are incapable of handling increased bit accuracy without providing for largely expanded visual displays and the corresponding increase in the size of the apparatus.

Figure 2:
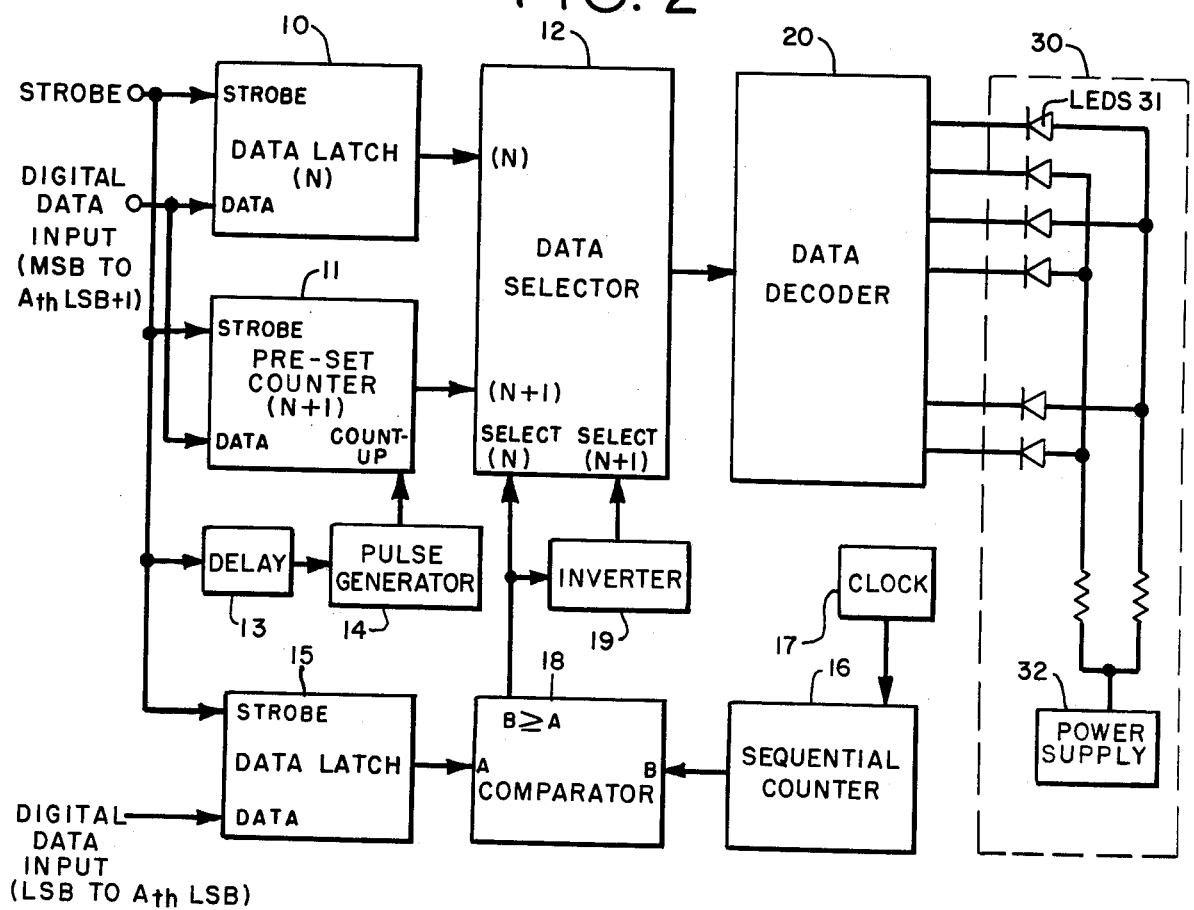
FIG. 2 is a schematic representation illustrating a system for providing enhanced resolution in accordance with the present invention.

Turning now to FIG. 2, a schematic diagram illustrates a visual display device constructed in accordance with the present invention. In this embodiment, the digital input representing the analog signal is formed by a group of most significant bits (MSB) and least significant bits (LSB) of a series of digital bits. The first group of bits (the MSB to the $A_{th}$ LSB+1) is provided as input to the data latch 10 in the same manner as all the digital bits were provided to the latch 10 in the embodiment of FIG. 1. In addition, this same group of bits is coupled as input to a preset counter 11. The preset counter 11 is constructed from circuitry similar to the latch 10 which samples and stores the digital bits upon receipt of a strobe signal and increases the digital number represented by those bits by a fixed amount (a logical one) upon receipt of a pulse at the count-up input. The second group of bits (the LSB to $A_{th}$ LSB) is provided as input to the data latch 15 having a construction identical to the latch 10. Accordingly, when a strobe signal is provided to each of the data latch 10, preset counter 11, and data latch 15, the first and second groups of bits will be sampled and stored in the respective storage circuits. The same strobe signal is also provided through the delay 13 to a pulse generator 14 such that a pulse output is provided by the generator 14 upon receipt of a delay strobe pulse from 13. This pulse output is coupled to the count-up input of counter 11, as shown, to cause the previously described increase in the value of the bits stored in register 11. The digital outputs from both the latch 10 and counter 11 are then coupled to a data selector 12 which will be subsequently described.

The digital output from data latch 15 is coupled as one input to a comparator 18 having a second input provided from the sequential counter 16. The comparator 18 is constructed as a typical logic circuit designed to provide an output when one of its inputs is equal to or greater than the other input. The sequential counter 15 is designed to have a bit capacity equal to the same number of bits stored in the digital latch 15. Clock 17 is coupled to provide a series of clock pulses to cause counter 16 to provide a count until the counter is full (all logic 1's), at which time the counter 16 will reset to zero and cycle through the count again. As shown, the comparator is coupled to provide an output when the digital input from the sequential counter 16 is equal to or greater than the digital input from latch 15. This output is subsequently coupled to the data selector 12 (typically a logic switching circuit) such that when the output signal from 18 appears, the data selector will couple the output from data latch 10 to the decoder 20. The output from 18 is additionally coupled to inverter 19 such that when the input from 15 is less than the input from 16, the absence of an output signal from 18 will cause the inverter 10 to provide a signal to selector 12 to couple the output from counter 11 to decoder 20. The output from decoder 20 will thus provide one of the groups of digits from 10 or 11 to energize the visual display at any given time. As was previously noted, the visual display may typically be formed as an LED array 30 constructed from a plurality of LEDs 31 connected in the conventional manner so that one terminal is coupled to the data decoder and the other terminal coupled to a source of power 32. Each LED is coupled such that a different LED will be energized to emit light for each different value of digital bits provided as input to the decoder 20. The position of the energized LED in the array will therefore provide an indication of the analog magnitude represented by the digital bits.

The operation of the inventive circuit to provide enhanced resolution will now be described with reference to FIG. 2. As was previously stated, a first group of digital bits (the MSB to the $A_{th}$ LSB+1) is provided as input to the data latch 10 and counter 11 and stored therein by the strobe signal. At the same time, the strobe signal is provided through delay 13 to pulse generator 14 to provide a count-up pulse to counter 11 such that the digital value stored in the counter 11 is increased by a logical one. Likewise, the second group of digital bits (the LSB to the $A_{th}$ LSB) is stored in the data latch 15 upon receipt of the strobe signal and provided as output to the comparator 18. At this time, the clock 17 provides a series of counting pulses which cause the counter 16 to sequentially count the clock pulses in a cyclic manner. Since the sequential counter has the same number of digits as data latch 15, the counter 16 will count until all digits are logical 1's and then reset to zero where the counting will cycle in a continuous manner. Since the output of counter 16 is provided as a second input to comparator 18, the contents of counter 16 and data latch 15 will be continuously compared. Thus, during the interval that the digital output from 16 is equal to or greater than the output from 15, an output will be provided from the comparator 18 to the data selector 12 and the data selector will couple the group of digits in latch 10 to the data decoder 20 to light a particular LED in the display 30. Alternatively, during that interval that the output from 15 is greater than the output from 16, the comparator will not provide an output to data selector 12, but the inverter 19 will provide a signal to the second input of data selector 12 such that the data in counter 11 will be coupled to the data decoder 20 causing the next adjacent LED in the sequence of the LED configuration to be energized. The output of the decoder 20 therefore provides a signal which represents either the digital value in data latch 10 or the digital value in counter 11 depending on the comparison between the lesser significant bits from 15 and the sequential counter 16. Consequently, if the clock is run at a sufficiently high frequency for the period between each sampling of digital data, the selection between the digital value in data latch 10 and the digital value in the counter 11 will be at such a rate that the switching in the visual display will not be discernable. The only condition that will be observed will be a difference in the relative brightness of the two energized LEDs which will be proportional to the time that each LED is energized by the corresponding digital bits from 10 or 11. As can be seen, the relative brightness will be determined by the lesser significant bits (LSB to $A_{th}$ LSB) which will therefore determine the resolution of the analog signal.

By way of example, if the analog signal is converted to provide eleven binary bits to be used for solid state display, the 8 MSBs could be coupled to the data latch 10 and counter 11 while the 3 LSBs could be coupled to the data latch 15. Upon the receipt of a strobe signal, the binary digits would be entered in each of the noted elements and the value in counter 11 would be increased by a logical 1. In particular, if the LSBs in the data latch 15 were, for example, 000, then the value provided at the output of counter 16 would always be equal to or greater than the value at the output of data latch 15 and only the group of digits from data latch 10 would be coupled to the decoder 20 causing the energization of only one LED in the display. If, however, the value in data latch 15 were 001, the sequential counter 16 would have an output less than the output of latch 15 on one count pulse and the output of counter 11 would be coupled to the data decoder 20 to energize the next adjacent LED in the display during that time period. At all other times, the output from the data latch 10 would be coupled to the data decoder 20. For each eight count of the counter 16, therefore, the value in counter 11 would cause the energization of one LED for ⅛ of the time while the value in the data latch 10 would cause the energization of another LED for ⅞ of the time.

Again, if the digital value in latch 15 were 010, the comparison between the elements 15 and 16 would cause the value at the output of data latch 10 to be represented by the display for ¾ of the time while the value at the output of counter 11 would be displayed by the LED display for only ¼ of a time. Such proportional energization of individual LED's will cause the brightness of each of the two LED's to be dependent on the length of time each is on. Since the relative brightness is proportional to the lesser significant bits, this action provides a resolution which would not otherwise be available where all digital digits are decoded to energize only one LED.

As can be seen by the above description, the present technique enables conventional solid state analog displays to be modified to provide for increased accuracy using only conventional solid state circuitry. Since the resolution depends on the relative brightness between several LEDs, the accuracy of a display having a fixed number of LED's can be increased by employing more bits without increasing the total number of LEDs in that display. Alternatively, for any fixed number of digital bits representing an analog signal, the same accuracy and resolution can be obtained with fewer LED elements. It can therefore be seen that the size and accuracy limitations imposed on conventional LED fields can be expanded beyond present capabilities. In this particular instance, the normal 8 bit word input resolution and 1 percent accuracy can be increased to a resolution in excess of 11 bits with an accuracy to at least 0.25 percent.

While the invention has been described with particular reference to specific bit lengths and LED configurations, it is evident that other bit lengths and configurations could be used consistent with the present teachings. By way of example, the configuration of the LED can be of any desirable form designed to display the data in the manner most useful for a particular application. Additionally, the clock frequency for cycling the counter 15 can be fixed at any rate which will eliminate eye discrimination of LED switching (e.g. 100 times per second).

Obviously many other modifications and variations of the present invention are possible in light of the above teachings. It is therefore to be understood that within the scope of the appended claims the invention may be practiced otherwise than as specifically described.

What is claimed and desired to be secured by letters patent of the United States is:

1. A system for providing increased resolution of a quantity represented by a digital signal comprising:
   first means for sampling and storing a first group of most significant bits from a series of digital bits forming a digital signal and providing an output thereof;
   second means for sampling and storing the same first group of digital bits and increasing its digital value by a fixed amount to provide an output thereof;
   third means for sampling and storing a second group of least significant bits from said series of digital bits and providing an output thereof; and
   fourth means responsive to said third means for selecting one of the outputs from said first and second means and providing the same as a signal output for a time proportional to the digital output of said third means.

2. The system of claim 1 wherein said fourth means comprises,
   means for generating a sequential digital count which cycles a plurality of times during each period that said groups of digital bits are provided,
   means for comparing the digital count with the second group of digital bits, and
   means for providing the output of said first means as said signal output when the value of said digital count equals or exceeds the value represented by said second group of digital bits and for providing the output of said second as said signal output when the value represented by said second group of digital bits exceeds said digital count.

3. The system of claim 1 further comprising strobing means for periodically causing the first, second, and third means to simultaneously sample and store their respective groups of digital bits.

4. The system of claim 1 further comprising,
   a visual display having individual illuminating elements, and
   means for coupling the signal output from said fourth means to illuminate one of said elements.

5. The system of claim 4 wherein said means for coupling comprises a digital data decoder coupled to illuminate a different one of said elements for each different digital value received as an output from said fourth means.

6. The system of claim 4 wherein the individual illuminating elements are serially arranged and positioned adjacent one another such that for each increment in the digital value at the output of said fourth means, the next adjacent diode will be illuminated.

7. The system of claim 4 wherein said illuminating elements are light emitting diodes.

8. The system of claim 1 wherein said fourth means comprises, clock means for providing clock pulses at a predetermined frequency, a sequential counter coupled to sequentially count in response to each clock pulse, means for comparing the digital values at the outputs of said sequential counter and said third means and providing a first signal when the digital value from the output of said counter is greater than or equal to the digital value at the output of said third means, means responsive to said means for comparing for providing a second signal when the digital value at the output of the sequential counter is less than the digital value at the output of said third means, and a data selector means for providing the digital output of said first means as an output in response to said first signal and for providing the digital output of said second means as an output in response to said second signal.

9. The system of claim 8 wherein said sequential counter is constructed to have an output with the same number of digits as the output of said third means.

10. The system of claim 8 further comprising strobing means for providing a strobe pulse which causes said first, second and thrid means to simultaneously sample and store the groups of digits.

11. The system of claim 10 wherein said first and third means are each constructed as a digital data latch and wherein said second means comprises;

a pre-set counter coupled to sample and store said second group of digital bits in response to a strobe pulse from said strobing means and having an input for increasing the value stored therein by said fixed amount in response to a count-up pulse, a delay coupled to provide a delayed strobe pulse from said strobing means, and a pulse generator coupled to provide said count-up pulse to the input of said pre-set counter in response to said delayed strobe pulse.

12. The system of claim 8 wherein said first and second means are coupled to sample and store a first predetermined number of bits of a series of digital bits as said first group of digital bits and wherein said third means is coupled to sample and store a second predetermined number of bits of the same series of digital bits as said second group of digital bits.

13. The system of claim 12 wherein said first predetermined number of bits are the most significant bits and the second predetermined number of bits are the least significant bits.

14. The system of claim 8 further comprising, a plurality of illuminating elements, and means for coupling the digital output from said data selector means to illuminate one of said elements for each different digital value provided by the output of said data selector means.

15. The system of claim 14 wherein said clock means is constructed to provide an output frequency such that the sequential counter will cycle multiple times during each sampling period and at a rate so that the relative brightness of the illuminating elements is substantially the only visual indication of switching between the illuminating elements.

* * * * *